United States Patent
Hiner et al.

(10) Patent No.: US 8,440,554 B1
(45) Date of Patent: May 14, 2013

(54) THROUGH VIA CONNECTED BACKSIDE EMBEDDED CIRCUIT FEATURES STRUCTURE AND METHOD

(75) Inventors: David Jon Hiner, Chandler, AZ (US); Ronald Patrick Huemoeller, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 150 days.

(21) Appl. No.: 12/848,820

(22) Filed: Aug. 2, 2010

(51) Int. Cl.
*H01L 29/41* (2006.01)
(52) U.S. Cl.
USPC ............ 438/584; 257/E23.067; 257/E21.158
(58) Field of Classification Search .................. 438/584, 438/928, 940; 257/E23.067, E21.158
See application file for complete search history.

(56) References Cited

U.S. PATENT DOCUMENTS

| | | | |
|---|---|---|---|
| 2,596,993 | A | 5/1952 | Gookin |
| 3,435,815 | A | 4/1969 | Forcier |
| 3,734,660 | A | 5/1973 | Davies et al. |
| 3,838,984 | A | 10/1974 | Crane et al. |
| 4,054,238 | A | 10/1977 | Lloyd et al. |
| 4,189,342 | A | 2/1980 | Kock |
| 4,258,381 | A | 3/1981 | Inaba |
| 4,289,922 | A | 9/1981 | Devlin |
| 4,301,464 | A | 11/1981 | Otsuki et al. |
| 4,332,537 | A | 6/1982 | Slepcevic |
| 4,394,712 | A | 7/1983 | Anthony |
| 4,417,266 | A | 11/1983 | Grabbe |
| 4,451,224 | A | 5/1984 | Harding |
| 4,499,655 | A | 2/1985 | Anthony |
| 4,530,152 | A | 7/1985 | Roche et al. |
| 4,541,003 | A | 9/1985 | Otsuka et al. |
| 4,646,710 | A | 3/1987 | Schmid et al. |
| 4,707,724 | A | 11/1987 | Suzuki et al. |
| 4,727,633 | A | 3/1988 | Herrick |
| 4,729,061 | A | 3/1988 | Brown |
| 4,737,839 | A | 4/1988 | Burt |
| 4,756,080 | A | 7/1988 | Thorp, Jr. et al. |
| 4,812,896 | A | 3/1989 | Rothgery et al. |
| 4,862,245 | A | 8/1989 | Pashby et al. |

(Continued)

FOREIGN PATENT DOCUMENTS

| | | |
|---|---|---|
| DE | 197 34 794 | 7/1998 |
| EP | 0 393 997 | 10/1990 |

(Continued)

OTHER PUBLICATIONS

Hiner et al., "Through Via Recessed Reveal Structure and Method", U.S. Appl. No. 12/985,888, filed Jan. 6, 2011.

(Continued)

*Primary Examiner* — Eduardo A Rodela
(74) *Attorney, Agent, or Firm* — McKay and Hodgson, LLP; Serge J. Hodgson

(57) ABSTRACT

A method includes forming through vias in a substrate of an array. Nubs of the through vias are exposed from a backside surface of the substrate. A backside passivation layer is applied to enclose the nubs. Laser-ablated artifacts are formed in the backside passivation layer to expose the nubs. Circuit features are formed within the laser-ablated artifacts. By forming the circuit features within the laser-ablated artifacts in the backside passivation layer, the cost of fabricating the array is minimized. More particularly, the number of operations to form the embedded circuit features is minimized thus minimizing fabrication cost of the array.

19 Claims, 13 Drawing Sheets

U.S. PATENT DOCUMENTS

| | | | |
|---|---|---|---|
| 4,862,246 A | 8/1989 | Masuda et al. | |
| 4,907,067 A | 3/1990 | Derryberry | |
| 4,920,074 A | 4/1990 | Shimizu et al. | |
| 4,935,803 A | 6/1990 | Kalfus et al. | |
| 4,942,454 A | 7/1990 | Mori et al. | |
| 4,987,475 A | 1/1991 | Schlesinger et al. | |
| 5,018,003 A | 5/1991 | Yasunaga et al. | |
| 5,029,386 A | 7/1991 | Chao et al. | |
| 5,041,902 A | 8/1991 | McShane | |
| 5,057,900 A | 10/1991 | Yamazaki | |
| 5,059,379 A | 10/1991 | Tsutsumi et al. | |
| 5,065,223 A | 11/1991 | Matsuki et al. | |
| 5,070,039 A | 12/1991 | Johnson et al. | |
| 5,087,961 A | 2/1992 | Long et al. | |
| 5,091,341 A | 2/1992 | Asada et al. | |
| 5,096,852 A | 3/1992 | Hobson | |
| 5,118,298 A | 6/1992 | Murphy | |
| 5,122,860 A | 6/1992 | Kikuchi et al. | |
| 5,134,773 A | 8/1992 | LeMaire et al. | |
| 5,151,039 A | 9/1992 | Murphy | |
| 5,157,475 A | 10/1992 | Yamaguchi | |
| 5,157,480 A | 10/1992 | McShane et al. | |
| 5,168,368 A | 12/1992 | Gow, 3rd et al. | |
| 5,172,213 A | 12/1992 | Zimmerman | |
| 5,172,214 A | 12/1992 | Casto | |
| 5,175,060 A | 12/1992 | Enomoto et al. | |
| 5,200,362 A | 4/1993 | Lin et al. | |
| 5,200,809 A | 4/1993 | Kwon | |
| 5,214,845 A | 6/1993 | King et al. | |
| 5,216,278 A | 6/1993 | Lin et al. | |
| 5,218,231 A | 6/1993 | Kudo | |
| 5,221,642 A | 6/1993 | Burns | |
| 5,229,647 A | 7/1993 | Gnadinger | |
| 5,245,751 A | 9/1993 | Locke et al. | |
| 5,250,841 A | 10/1993 | Sloan et al. | |
| 5,252,853 A | 10/1993 | Michii | |
| 5,258,094 A | 11/1993 | Furui et al. | |
| 5,266,834 A | 11/1993 | Nishi et al. | |
| 5,268,310 A | 12/1993 | Goodrich et al. | |
| 5,273,938 A | 12/1993 | Lin et al. | |
| 5,277,972 A | 1/1994 | Sakumoto et al. | |
| 5,278,446 A | 1/1994 | Nagaraj et al. | |
| 5,279,029 A | 1/1994 | Burns | |
| 5,281,849 A | 1/1994 | Singh Deo et al. | |
| 5,294,897 A | 3/1994 | Notani et al. | |
| 5,327,008 A | 7/1994 | Djennas et al. | |
| 5,332,864 A | 7/1994 | Liang et al. | |
| 5,335,771 A | 8/1994 | Murphy | |
| 5,336,931 A | 8/1994 | Juskey et al. | |
| 5,343,076 A | 8/1994 | Katayama et al. | |
| 5,353,498 A | 10/1994 | Fillion et al. | |
| 5,358,905 A | 10/1994 | Chiu | |
| 5,365,106 A | 11/1994 | Watanabe | |
| 5,381,042 A | 1/1995 | Lerner et al. | |
| 5,391,439 A | 2/1995 | Tomita et al. | |
| 5,394,303 A | 2/1995 | Yamaji | |
| 5,406,124 A | 4/1995 | Morita et al. | |
| 5,410,180 A | 4/1995 | Fuji et al. | |
| 5,414,299 A | 5/1995 | Wang et al. | |
| 5,417,905 A | 5/1995 | Lemaire et al. | |
| 5,424,576 A | 6/1995 | Djennas et al. | |
| 5,428,248 A | 6/1995 | Cha | |
| 5,432,677 A | 7/1995 | Mowatt et al. | |
| 5,435,057 A | 7/1995 | Bindra et al. | |
| 5,444,301 A | 8/1995 | Song et al. | |
| 5,452,511 A | 9/1995 | Chang | |
| 5,454,905 A | 10/1995 | Fogelson | |
| 5,474,958 A | 12/1995 | Djennas et al. | |
| 5,484,274 A | 1/1996 | Neu | |
| 5,493,151 A | 2/1996 | Asada et al. | |
| 5,508,556 A | 4/1996 | Lin | |
| 5,517,056 A | 5/1996 | Bigler et al. | |
| 5,521,429 A | 5/1996 | Aono et al. | |
| 5,528,076 A | 6/1996 | Pavio | |
| 5,534,467 A | 7/1996 | Rostoker | |
| 5,539,251 A | 7/1996 | Iverson et al. | |
| 5,543,657 A | 8/1996 | Diffenderfer et al. | |
| 5,544,412 A | 8/1996 | Romero et al. | |
| 5,545,923 A | 8/1996 | Barber | |
| 5,576,517 A | 11/1996 | Wojnarowski et al. | |
| 5,578,525 A | 11/1996 | Mizukoshi | |
| 5,581,122 A | 12/1996 | Chao et al. | |
| 5,592,019 A | 1/1997 | Ueda et al. | |
| 5,592,025 A | 1/1997 | Clark et al. | |
| 5,594,274 A | 1/1997 | Suetaki | |
| 5,595,934 A | 1/1997 | Kim | |
| 5,604,376 A | 2/1997 | Hamburgen et al. | |
| 5,608,264 A * | 3/1997 | Gaul | 257/734 |
| 5,608,265 A | 3/1997 | Kitano et al. | |
| 5,608,267 A | 3/1997 | Mahulikar et al. | |
| 5,619,068 A | 4/1997 | Benzoni | |
| 5,625,222 A | 4/1997 | Yoneda et al. | |
| 5,633,528 A | 5/1997 | Abbott et al. | |
| 5,639,990 A | 6/1997 | Nishihara et al. | |
| 5,640,047 A | 6/1997 | Nakashima | |
| 5,641,997 A | 6/1997 | Ohta et al. | |
| 5,643,433 A | 7/1997 | Fukase et al. | |
| 5,644,169 A | 7/1997 | Chun | |
| 5,646,831 A | 7/1997 | Manteghi | |
| 5,650,663 A | 7/1997 | Parthasarathi | |
| 5,661,088 A | 8/1997 | Tessier et al. | |
| 5,665,996 A | 9/1997 | Williams et al. | |
| 5,673,479 A | 10/1997 | Hawthorne | |
| 5,683,806 A | 11/1997 | Sakumoto et al. | |
| 5,689,135 A | 11/1997 | Ball | |
| 5,696,666 A | 12/1997 | Miles et al. | |
| 5,701,034 A | 12/1997 | Marrs | |
| 5,703,407 A | 12/1997 | Hori | |
| 5,710,064 A | 1/1998 | Song et al. | |
| 5,723,899 A | 3/1998 | Shin | |
| 5,724,233 A | 3/1998 | Honda et al. | |
| 5,726,493 A | 3/1998 | Yamashita et al. | |
| 5,736,432 A | 4/1998 | Mackessy | |
| 5,736,448 A | 4/1998 | Saia et al. | |
| 5,745,984 A | 5/1998 | Cole, Jr. et al. | |
| 5,753,532 A | 5/1998 | Sim | |
| 5,753,977 A | 5/1998 | Kusaka et al. | |
| 5,766,972 A | 6/1998 | Takahashi et al. | |
| 5,769,989 A | 6/1998 | Hoffmeyer et al. | |
| 5,770,888 A | 6/1998 | Song et al. | |
| 5,776,798 A | 7/1998 | Quan et al. | |
| 5,783,861 A | 7/1998 | Son | |
| 5,786,238 A | 7/1998 | Pai et al. | |
| 5,801,440 A | 9/1998 | Chu et al. | |
| 5,814,877 A | 9/1998 | Diffenderfer et al. | |
| 5,814,881 A | 9/1998 | Alagaratnam et al. | |
| 5,814,883 A | 9/1998 | Sawai et al. | |
| 5,814,884 A | 9/1998 | Davis et al. | |
| 5,817,540 A | 10/1998 | Wark | |
| 5,818,105 A | 10/1998 | Kouda | |
| 5,821,457 A | 10/1998 | Mosley et al. | |
| 5,821,615 A | 10/1998 | Lee | |
| 5,834,830 A | 11/1998 | Cho | |
| 5,835,988 A | 11/1998 | Ishii | |
| 5,841,193 A | 11/1998 | Eichelberger | |
| 5,844,306 A | 12/1998 | Fujita et al. | |
| 5,856,911 A | 1/1999 | Riley | |
| 5,859,471 A | 1/1999 | Kuraishi et al. | |
| 5,859,475 A | 1/1999 | Freyman et al. | |
| 5,866,939 A | 2/1999 | Shin et al. | |
| 5,871,782 A | 2/1999 | Choi | |
| 5,874,770 A | 2/1999 | Saia et al. | |
| 5,874,784 A | 2/1999 | Aoki et al. | |
| 5,877,043 A | 3/1999 | Alcoe et al. | |
| 5,886,397 A | 3/1999 | Ewer | |
| 5,886,398 A | 3/1999 | Low et al. | |
| 5,894,108 A | 4/1999 | Mostafazadeh et al. | |
| 5,897,339 A | 4/1999 | Song et al. | |
| 5,900,676 A | 5/1999 | Kweon et al. | |
| 5,903,049 A | 5/1999 | Mori | |
| 5,903,050 A | 5/1999 | Thurairajaratnam et al. | |
| 5,909,053 A | 6/1999 | Fukase et al. | |
| 5,915,998 A | 6/1999 | Stidham et al. | |
| 5,917,242 A | 6/1999 | Ball | |
| 5,937,324 A | 8/1999 | Abercrombie et al. | |
| 5,939,779 A | 8/1999 | Kim | |
| 5,942,794 A | 8/1999 | Okumura et al. | |

| | | |
|---|---|---|
| 5,951,305 A | 9/1999 | Haba |
| 5,959,356 A | 9/1999 | Oh |
| 5,969,426 A | 10/1999 | Baba et al. |
| 5,973,388 A | 10/1999 | Chew et al. |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,982,632 A | 11/1999 | Mosley et al. |
| 5,986,333 A | 11/1999 | Nakamura |
| 5,986,885 A | 11/1999 | Wyland |
| 6,001,671 A | 12/1999 | Fjelstad |
| 6,013,947 A | 1/2000 | Lim |
| 6,018,189 A | 1/2000 | Mizuno |
| 6,020,625 A | 2/2000 | Qin et al. |
| 6,025,640 A | 2/2000 | Yagi et al. |
| 6,031,279 A | 2/2000 | Lenz |
| RE36,613 E | 3/2000 | Ball |
| 6,034,423 A | 3/2000 | Mostafazadeh et al. |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,072,228 A | 6/2000 | Hinkle et al. |
| 6,075,284 A | 6/2000 | Choi et al. |
| 6,081,029 A | 6/2000 | Yamaguchi |
| 6,084,310 A | 7/2000 | Mizuno et al. |
| 6,087,715 A | 7/2000 | Sawada et al. |
| 6,087,722 A | 7/2000 | Lee et al. |
| 6,100,594 A | 8/2000 | Fukui et al. |
| 6,113,474 A | 9/2000 | Shih et al. |
| 6,114,752 A | 9/2000 | Huang et al. |
| 6,118,174 A | 9/2000 | Kim |
| 6,118,184 A | 9/2000 | Ishio et al. |
| RE36,907 E | 10/2000 | Templeton, Jr. et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,168,969 B1 | 1/2001 | Farnworth |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,250 B1 | 2/2001 | Melton et al. |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,214,525 B1 | 4/2001 | Boyko et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,239,367 B1 | 5/2001 | Hsuan et al. |
| 6,239,384 B1 | 5/2001 | Smith et al. |
| 6,242,281 B1 | 6/2001 | Mclellan et al. |
| 6,256,200 B1 | 7/2001 | Lam et al. |
| 6,258,192 B1 | 7/2001 | Natarajan |
| 6,258,629 B1 | 7/2001 | Niones et al. |
| 6,261,918 B1 | 7/2001 | So |
| 6,281,566 B1 | 8/2001 | Magni |
| 6,281,568 B1 | 8/2001 | Glenn et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,822 B1 | 11/2001 | Venkateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karnezos et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,355,502 B1 | 3/2002 | Kang et al. |
| 6,365,974 B1 | 4/2002 | Abbott et al. |
| 6,369,447 B2 | 4/2002 | Mori |
| 6,369,454 B1 | 4/2002 | Chung |
| 6,373,127 B1 | 4/2002 | Baudouin et al. |
| 6,379,982 B1 | 4/2002 | Ahn et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,396,148 B1 | 5/2002 | Eichelberger et al. |
| 6,396,153 B2 | 5/2002 | Fillion et al. |
| 6,400,004 B1 | 6/2002 | Fan et al. |
| 6,406,934 B1 | 6/2002 | Glenn et al. |
| 6,410,979 B2 | 6/2002 | Abe |
| 6,414,385 B1 | 7/2002 | Huang et al. |
| 6,420,779 B1 | 7/2002 | Sharma et al. |
| 6,429,508 B1 | 8/2002 | Gang |
| 6,429,509 B1 | 8/2002 | Hsuan |
| 6,437,429 B1 | 8/2002 | Su et al. |
| 6,444,499 B1 | 9/2002 | Swiss et al. |
| 6,448,633 B1 | 9/2002 | Yee et al. |
| 6,448,661 B1 | 9/2002 | Kim et al. |
| 6,452,279 B2 | 9/2002 | Shimoda |
| 6,459,148 B1 | 10/2002 | Chun-Jen et al. |
| 6,464,121 B2 | 10/2002 | Reijnders |
| 6,476,469 B2 | 11/2002 | Hung et al. |
| 6,476,474 B1 | 11/2002 | Hung |
| 6,482,680 B1 | 11/2002 | Khor et al. |
| 6,498,099 B1 | 12/2002 | McLellan et al. |
| 6,498,392 B2 | 12/2002 | Azuma |
| 6,507,096 B2 | 1/2003 | Gang |
| 6,507,120 B2 | 1/2003 | Lo et al. |
| 6,521,530 B2 | 2/2003 | Peters et al. |
| 6,524,885 B2 | 2/2003 | Pierce |
| 6,534,849 B1 | 3/2003 | Gang |
| 6,545,332 B2 | 4/2003 | Huang |
| 6,545,345 B1 | 4/2003 | Glenn et al. |
| 6,559,525 B2 | 5/2003 | Huang |
| 6,566,168 B2 | 5/2003 | Gang |
| 6,573,461 B2 | 6/2003 | Roeters et al. |
| 6,577,013 B1 | 6/2003 | Glenn et al. |
| 6,583,503 B2 | 6/2003 | Akram et al. |
| 6,593,645 B2 | 7/2003 | Shih et al. |
| 6,603,196 B2 | 8/2003 | Lee et al. |
| 6,608,371 B2 | 8/2003 | Kurashima et al. |
| 6,624,005 B1 | 9/2003 | DiCaprio et al. |
| 6,667,546 B2 | 12/2003 | Huang et al. |
| 6,671,398 B2 | 12/2003 | Reinhorn et al. |
| 6,727,576 B2 | 4/2004 | Hedler et al. |
| 6,730,857 B2 | 5/2004 | Konrad et al. |
| 6,740,964 B2 | 5/2004 | Sasaki |
| 6,780,770 B2 | 8/2004 | Larson |
| 6,831,371 B1 | 12/2004 | Huemoeller et al. |
| 6,838,776 B2 | 1/2005 | Leal et al. |
| 6,845,554 B2 | 1/2005 | Frankowsky et al. |
| 6,853,572 B1 | 2/2005 | Sabharwal |
| 6,873,054 B2 | 3/2005 | Miyazawa et al. |
| 6,905,914 B1 | 6/2005 | Huemoeller et al. |
| 6,919,514 B2 | 7/2005 | Konrad et al. |
| 6,921,975 B2 | 7/2005 | Leal et al. |
| 6,930,256 B1 | 8/2005 | Huemoeller et al. |

| | | | | | |
|---|---|---|---|---|---|
| 7,015,075 B2 | 3/2006 | Fay et al. | EP | 0 844 665 | 5/1998 |
| 7,022,609 B2 * | 4/2006 | Yamamoto et al. ........... 438/694 | EP | 0 936 671 | 8/1999 |
| 7,041,534 B2 | 5/2006 | Chao et al. | EP | 0 989 608 | 3/2000 |
| 7,129,158 B2 | 10/2006 | Nakai | EP | 1 032 037 | 8/2000 |
| 7,151,009 B2 | 12/2006 | Kim et al. | JP | 55-163868 | 12/1980 |
| 7,190,062 B1 | 3/2007 | Sheridan et al. | JP | 57-045959 | 3/1982 |
| 7,192,807 B1 | 3/2007 | Huemoeller et al. | JP | 59-208756 | 11/1984 |
| 7,208,838 B2 | 4/2007 | Masuda | JP | 59-227143 | 12/1984 |
| 7,223,634 B2 | 5/2007 | Yamaguchi | JP | 60-010756 | 1/1985 |
| 7,242,081 B1 | 7/2007 | Lee | JP | 60-116239 | 6/1985 |
| 7,247,523 B1 | 7/2007 | Huemoeller et al. | JP | 60-195957 | 10/1985 |
| 7,272,444 B2 | 9/2007 | Peterson et al. | JP | 60-231349 | 11/1985 |
| 7,345,361 B2 | 3/2008 | Mallik et al. | JP | 61-039555 | 2/1986 |
| 7,361,533 B1 | 4/2008 | Huemoeller et al. | JP | 62-009639 | 1/1987 |
| 7,372,151 B1 | 5/2008 | Fan et al. | JP | 63-033854 | 2/1988 |
| 7,420,272 B1 | 9/2008 | Huemoeller et al. | JP | 63-067762 | 3/1988 |
| 7,572,681 B1 | 8/2009 | Huemoeller et al. | JP | 63-188964 | 8/1988 |
| 7,632,753 B1 | 12/2009 | Rusli et al. | JP | 63-205935 | 8/1988 |
| 7,692,286 B1 | 4/2010 | Huemoeller et al. | JP | 63-233555 | 9/1988 |
| 7,714,431 B1 * | 5/2010 | Huemoeller et al. ......... 257/700 | JP | 63-249345 | 10/1988 |
| 7,723,210 B2 | 5/2010 | Berry et al. | JP | 63-289951 | 11/1988 |
| 7,777,351 B1 | 8/2010 | Berry et al. | JP | 63-316470 | 12/1988 |
| 7,932,595 B1 * | 4/2011 | Huemoeller et al. ......... 257/700 | JP | 64-054749 | 3/1989 |
| 7,973,415 B2 * | 7/2011 | Kawashita et al. ........... 257/775 | JP | 01-106456 | 4/1989 |
| 8,209,856 B2 * | 7/2012 | Mori et al. ...................... 29/829 | JP | 01-175250 | 7/1989 |
| 2001/0008305 A1 | 7/2001 | McLellan et al. | JP | 01-205544 | 8/1989 |
| 2001/0011654 A1 | 8/2001 | Schmidt et al. | JP | 01-251747 | 10/1989 |
| 2001/0012704 A1 | 8/2001 | Eldridge | JP | 02-129948 | 5/1990 |
| 2001/0014538 A1 | 8/2001 | Kwan et al. | JP | 03-069248 | 7/1991 |
| 2002/0017710 A1 | 2/2002 | Kurashima et al. | JP | 03-177060 | 8/1991 |
| 2002/0024122 A1 | 2/2002 | Jung et al. | JP | 04-098864 | 3/1992 |
| 2002/0027297 A1 | 3/2002 | Ikenaga et al. | JP | 05-129473 | 5/1993 |
| 2002/0030245 A1 * | 3/2002 | Hanaoka et al. ............. 257/621 | JP | 05-166992 | 7/1993 |
| 2002/0061642 A1 | 5/2002 | Haji et al. | JP | 05-283460 | 10/1993 |
| 2002/0140061 A1 | 10/2002 | Lee | JP | 06-092076 | 4/1994 |
| 2002/0140068 A1 | 10/2002 | Lee et al. | JP | 06-140563 | 5/1994 |
| 2002/0163015 A1 | 11/2002 | Lee et al. | JP | 06-260532 | 9/1994 |
| 2003/0013232 A1 | 1/2003 | Towle et al. | JP | 07-297344 | 11/1995 |
| 2003/0030131 A1 | 2/2003 | Lee et al. | JP | 07-312405 | 11/1995 |
| 2003/0038344 A1 | 2/2003 | Palmer et al. | JP | 08-064634 | 3/1996 |
| 2003/0064548 A1 | 4/2003 | Isaak | JP | 08-083877 | 3/1996 |
| 2003/0073265 A1 | 4/2003 | Hu et al. | JP | 08-125066 | 5/1996 |
| 2003/0085460 A1 * | 5/2003 | Siniaguine .................... 257/698 | JP | 08-222682 | 8/1996 |
| 2003/0134455 A1 | 7/2003 | Cheng et al. | JP | 08-306853 | 11/1996 |
| 2003/0207566 A1 | 11/2003 | Forbes et al. | JP | 09-008205 | 1/1997 |
| 2004/0004293 A1 | 1/2004 | Murayama | JP | 09-008206 | 1/1997 |
| 2004/0026781 A1 | 2/2004 | Nakai | JP | 09-008207 | 1/1997 |
| 2004/0046244 A1 | 3/2004 | Nakamura et al. | JP | 09-092775 | 4/1997 |
| 2004/0056277 A1 | 3/2004 | Karnezos | JP | 09-293822 | 11/1997 |
| 2004/0061212 A1 | 4/2004 | Karnezos | JP | 10-022447 | 1/1998 |
| 2004/0061213 A1 | 4/2004 | Karnezos | JP | 10-163401 | 6/1998 |
| 2004/0063242 A1 | 4/2004 | Karnezos | JP | 10-199934 | 7/1998 |
| 2004/0063246 A1 | 4/2004 | Karnezos | JP | 10-256240 | 9/1998 |
| 2004/0113260 A1 | 6/2004 | Sunohara et al. | JP | 2000-150765 | 5/2000 |
| 2004/0192033 A1 | 9/2004 | Hara | JP | 2000-556398 | 10/2000 |
| 2004/0251554 A1 | 12/2004 | Masuda | JP | 2001-060648 | 3/2001 |
| 2005/0029630 A1 | 2/2005 | Matsuo | JP | 2002-043497 | 2/2002 |
| 2005/0046002 A1 | 3/2005 | Lee et al. | KR | 1994-0001979 | 1/1994 |
| 2005/0104181 A1 | 5/2005 | Lee et al. | KR | 10-0220154 | 6/1999 |
| 2005/0242425 A1 | 11/2005 | Leal et al. | KR | 2002-0049944 | 6/2002 |
| 2005/0263869 A1 | 12/2005 | Tanaka et al. | WO | WO 99/56316 | 11/1999 |
| 2005/0282314 A1 | 12/2005 | Lo et al. | WO | WO 99/67821 | 12/1999 |
| 2007/0007639 A1 | 1/2007 | Fukazawa | | | |
| 2007/0273049 A1 | 11/2007 | Khan et al. | | | |
| 2007/0290376 A1 | 12/2007 | Zhao et al. | | | |
| 2008/0230887 A1 | 9/2008 | Sun et al. | | | |
| 2008/0277799 A1 * | 11/2008 | Benson et al. ................ 257/774 | | | |
| 2009/0020865 A1 | 1/2009 | Su | | | |
| 2009/0039527 A1 | 2/2009 | Chan et al. | | | |
| 2010/0008058 A1 | 1/2010 | Saen et al. | | | |
| 2010/0059855 A1 * | 3/2010 | Lin et al. ...................... 257/528 | | | |
| 2012/0018868 A1 * | 1/2012 | Oganesian et al. ........... 257/686 | | | |
| 2012/0175784 A1 * | 7/2012 | Lin et al. ...................... 257/774 | | | |

FOREIGN PATENT DOCUMENTS

| | | |
|---|---|---|
| EP | 0 459 493 | 12/1991 |
| EP | 0 720 225 | 7/1996 |
| EP | 0 720 234 | 7/1996 |
| EP | 0 794 572 | 9/1997 |

OTHER PUBLICATIONS

Do et al., "Semiconductor Device and Manufacturing Thereof", U.S. Appl. No. 12/898,192, filed Oct. 5, 2010.

Kim et al., "Application of Through Mold Via (TMV) as PoP base package", 58$^{th}$ ECTC Proceedings, May 2008, Lake Buena Vista, FL, 6 pages, IEEE.

Scanlan, "Package-on-package (PoP) with Through-mold Vias", Advanced Packaging, Jan. 2008, 3 pages, vol. 17, Issue 1, PennWell Corporation.

Huemoeller et al., "Integrated Circuit Film Substrate Having Embedded Conductive Patterns and Vias", U.S. Appl. No. 10/261,868, filed Oct. 1, 2002.

Berry et al., "Direct-write Wafer Level Chip Scale Package", U.S. Appl. No. 11/289,826, filed Nov. 29, 2005.

Lee et al., "Substrate for Semiconductor Device and Manufacturing Method Thereof", U.S. Appl. No. 11/440,548, filed May 24, 2006.

Park et al., "Semiconductor Package and Fabricating Method Thereof", U.S. Appl. No. 12/190,039, filed Aug. 12, 2008.

Yoo et al., "Semiconductor Devices and Fabrication Methods Thereof", U.S. Appl. No. 12/270,690, filed Nov. 13, 2008.

Huemoeller et al., "Embedded Electronic Component Package Fabrication Method", U.S. Appl. No. 12/459,532, filed Jul. 2, 2009.

Berry et al., "Direct-Write Wafer Level Chip Scale Package", U.S. Appl. No. 12/661,597, filed Mar. 19, 2010.

Huemoeller et al., "Through Via Nub Reveal Method and Structure", U.S. Appl. No. 12/754,837, filed Apr. 6, 2010.

* cited by examiner

Through via connected backside embedded circuit features method 100

US 8,440,554 B1

THROUGH VIA CONNECTED BACKSIDE EMBEDDED CIRCUIT FEATURES STRUCTURE AND METHOD

TECHNICAL FIELD

The present application relates to the field of electronics, and more particularly, to methods of forming electronic component packages and related structures.

BACKGROUND

To allow backside contact to an electronic component such as an integrated circuit die, electrically conductive through vias are formed in the electronic component. The through vias extend entirely through the electronic component from the active surface to the inactive surface of the electronic component. Electrical connections to the through vias at the inactive surface of the electronic component are then possible.

BRIEF DESCRIPTION OF THE DRAWINGS

In the following description, the same or similar elements are labeled with the same or similar reference numbers.

DETAILED DESCRIPTION

Figure 2A:
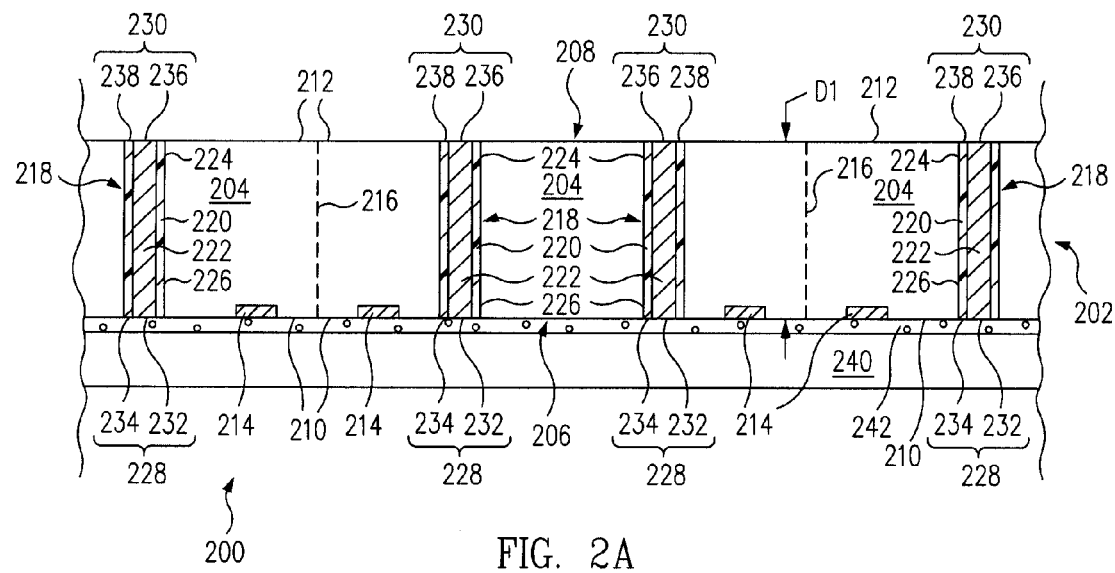
FIG. 2A is a cross-sectional view of an array including a substrate including a plurality of electronic components in accordance with one embodiment.
Figure 3A:
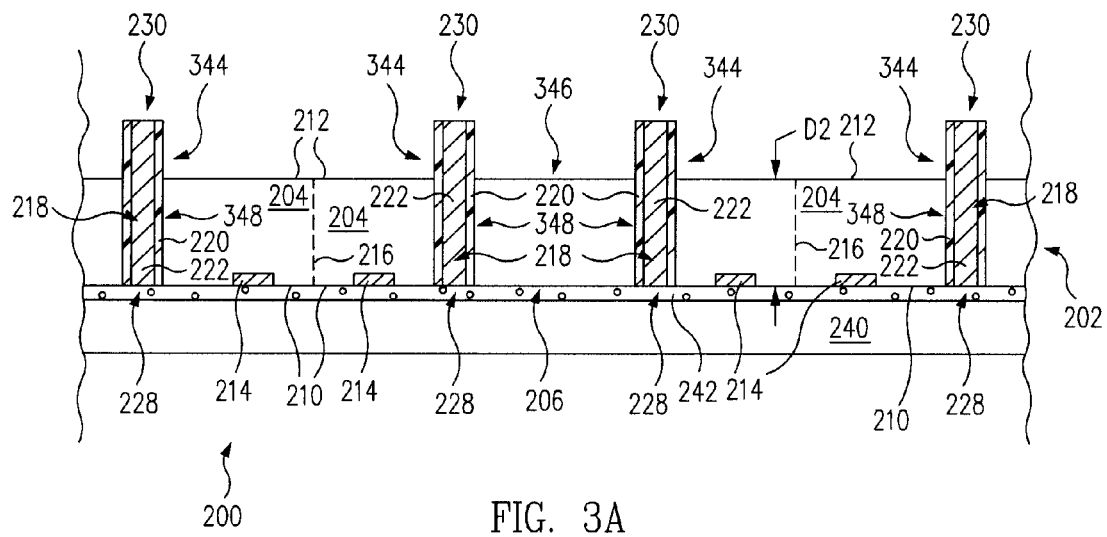
FIG. 3A is a cross-sectional view of the array of FIG. 2A at a later stage during fabrication in accordance with one embodiment.
Figure 4:
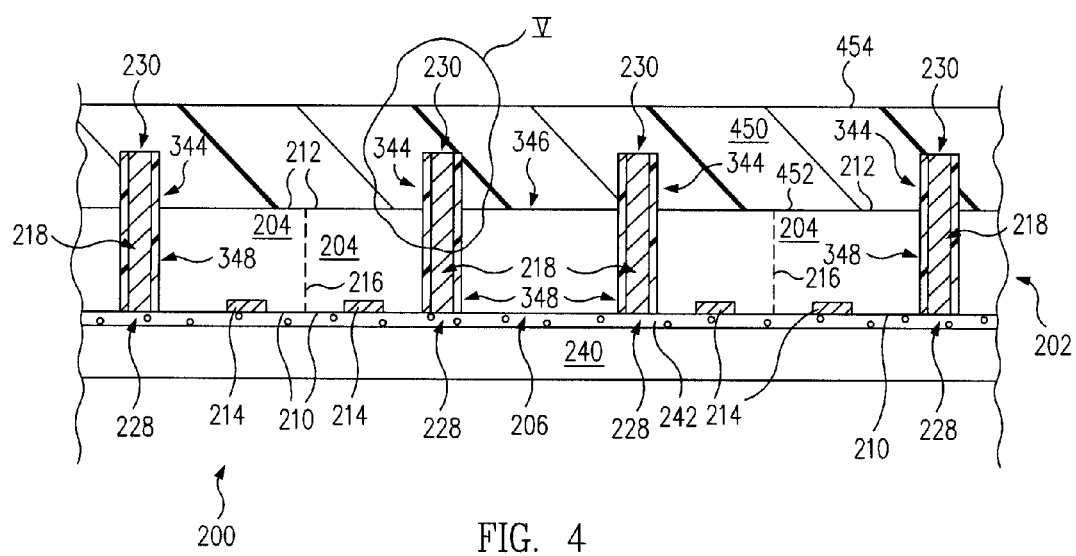
FIG. 4 is a cross-sectional view of the array of FIG. 3A at a later stage during fabrication in accordance with one embodiment.
Figure 9:
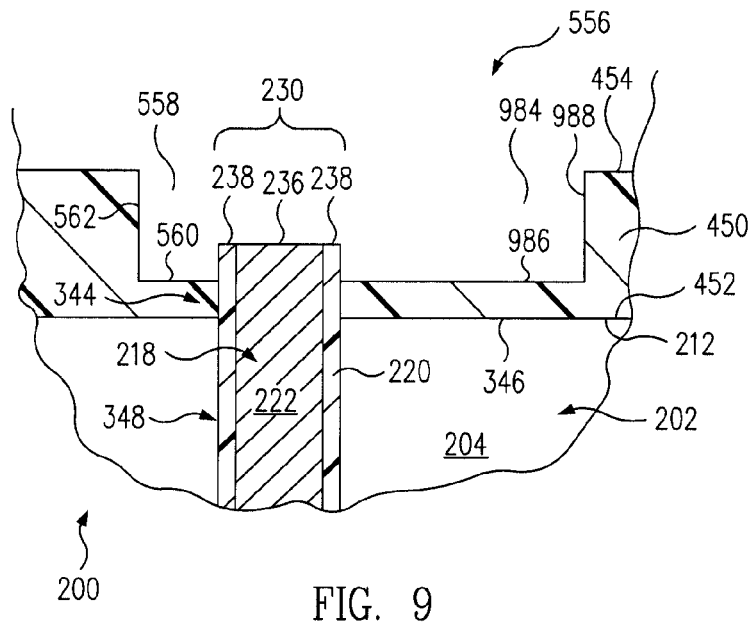
FIG. 9 is an enlarged cross-sectional view of the region V of the array of FIG. 4 at a later stage during fabrication in accordance with another embodiment.
Figure 10:
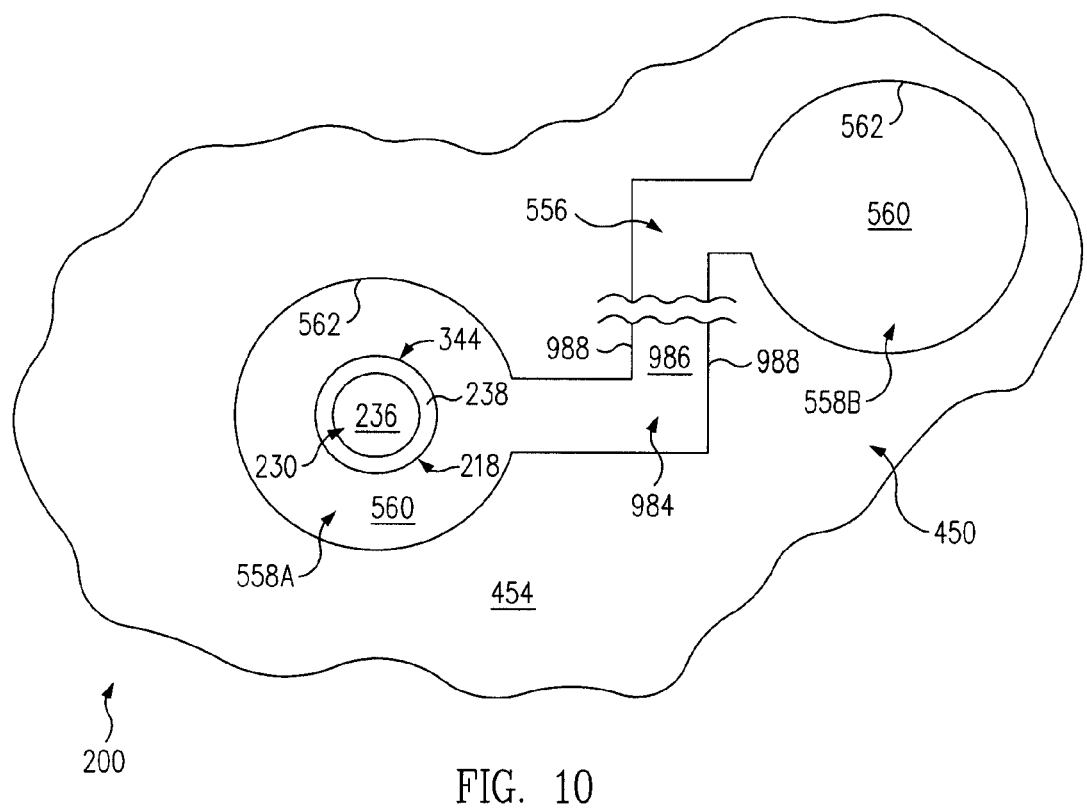
FIG. 10 is a top plan view of the array of FIG. 9 in accordance with one embodiment.

As an overview and in accordance with one embodiment, referring to FIG. 2A, a method includes forming through vias 218 in a substrate 202 of an array 200. Referring now to FIG. 3A, nubs 344 of through vias 218 are exposed from a recessed backside surface 346 of substrate 202. Referring now to FIG. 4, a backside passivation layer 450 is applied to enclose nubs 344. Referring now to FIGS. 9 and 10 together, laser-ablated artifacts 556 are formed in backside passivation layer 450 to expose nubs 344. Referring to FIGS. 9, 10, 12, and 13 together, circuit features 872 are formed within laser-ablated artifacts 556. By forming circuit features 872 within laser-ablated artifacts 556 in backside passivation layer 450, the cost of fabricating array 200 is minimized. More particularly, the number of operations to form embedded circuit features 872 is minimized thus minimizing fabrication cost of array 200.

Figure 1:
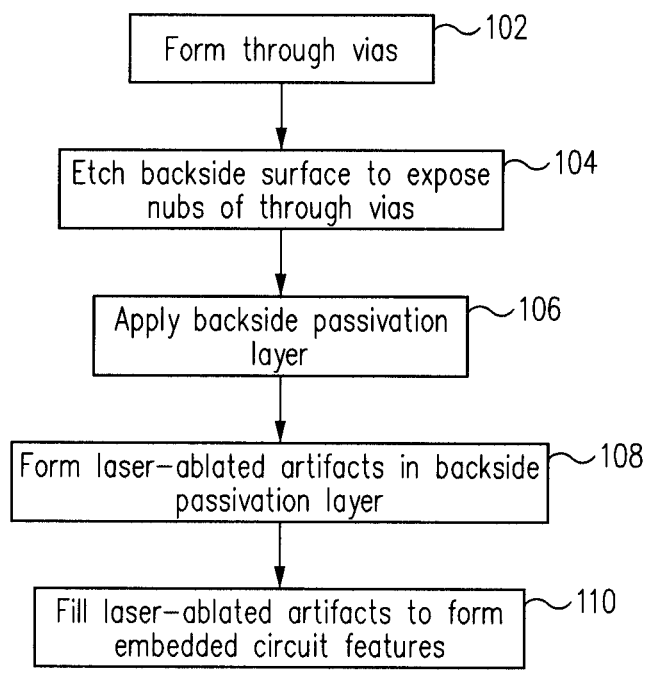
FIG. 1 is a block diagram of a through via connected backside embedded circuit features method in accordance with one embodiment.

Now in more detail, FIG. 1 is a block diagram of a through via connected backside embedded circuit features method 100 in accordance with one embodiment.

FIG. 2A is a cross-sectional view of an array 200 including a substrate 202 including a plurality of electronic components 204 in accordance with one embodiment.

In one embodiment, substrate 202 is a silicon wafer. Substrate 202 includes a frontside, e.g., first, surface 206 and an opposite backside, e.g., second, surface 208.

Substrate 202 includes electronic components 204 integrally connected to one another. For simplicity, the term substrate 202 shall be used herein and it is to be understood that this term generally includes electronic components 204.

In one embodiment, electronic components 204 are integrated circuit chips, e.g., active components. However, in other embodiments, electronic components 204 are passive components such as capacitors, resistors, or inductors.

In accordance with this embodiment, electronic components 204 include active surfaces 210 and opposite inactive surfaces 212. Active surfaces 210 and inactive surfaces 212 generally define frontside surface 206 and backside surface 208 of substrate 202, respectively. For simplicity, the terms frontside surface 206 and backside surface 208 shall be used herein and it is to be understood that these terms generally include active surfaces 210 and inactive surfaces 212, respectively. Electronic components 204 further includes bond pads 214 formed on active surfaces 210.

Electronic components 204 are delineated from one another by singulation streets 216. Substrate 202 is singulated, e.g., sawed, along singulation streets 216 to separate electronic components 204 from one another at a later stage during fabrication.

Referring now to FIGS. 1 and 2A together, in a form through vias operation 102, through vias 218 are formed through electronic components 204. Through vias 218 include dielectric through via passivation linings 220 and electrically conductive through via columns 222.

Illustratively, through via apertures 224 are formed, e.g., by laser drilling, into electronic components 204 from frontside surface 206. Through via passivation linings 220, e.g., silicon oxide ($SiO_2$), are formed on the sidewalls of through via apertures 224. In one embodiment, the silicon of substrate 202 exposed within through via apertures 224 is oxidized to form through via passivation linings 220. In another embodiment, a dielectric material is deposited within through via apertures 224 to form through via passivation linings 220.

Through via columns 222 are formed within through via passivation linings 220. Illustratively, an electrically conductive material, e.g., copper or tungsten, is deposited, e.g., plated, within through via passivation linings 220 to form through via columns 222. Through via passivation linings 220 electrically isolate through via columns 222 from substrate 202.

Substrate 202 is then thinned, sometimes called backgrinded, to expose through vias 218 at backside surface 208 of substrate 202. Through via passivation linings 220 are hollow cylinders and through via columns 222 are solid cylinders formed within through via passivation linings 220.

Through vias 218 are cylindrical in shape although may taper slightly between frontside surface 206 and backside surface 208. More particularly, through vias 218 include cylindrical outer surfaces 226, circular active surface ends 228, and circular inactive surface ends 230.

Cylindrical outer surfaces 226 are defined by the cylindrical outer surfaces of through via passivation linings 220 of through vias 218. Cylindrical outer surfaces 226 extend perpendicularly between frontside surface 206 and backside surface 208. Cylindrical outer surfaces 226 extend from active surface ends 228 to inactive surface ends 230. Although the terms parallel, perpendicular, and similar terms are used herein to describe various features, in light of this disclosure, those of skill in the art will understand that the features may not be exactly parallel or perpendicular but only substantially parallel or perpendicular to within accepted manufacturing tolerances.

Active surface ends 228 are circular in accordance with this embodiment. Active surface ends 228 are coplanar with and parallel to frontside surface 206 of substrate 202.

Active surface ends 228 includes circular active surface column ends 232 surrounded by annular active surface passivation lining ends 234. Active surface column ends 232 are the lower ends of through via columns 222 and thus are electrically conductive. Active surface passivation lining ends 234 are the lower ends of through via passivation linings 220 and thus are a dielectric.

Similarly, inactive surface ends 230 are circular in accordance with this embodiment. Inactive surface ends 230 are coplanar with and parallel to backside surface 208 of substrate 202.

Inactive surface ends 230 includes circular inactive surface column ends 236 surrounded by annular inactive surface passivation lining ends 238. Inactive surface column ends 236 are the upper ends of through via columns 222 and thus are electrically conductive. Inactive surface passivation lining ends 238 are the upper ends of through via passivation linings 220 and thus are a dielectric.

As illustrated in FIG. 2A, frontside surface 206 of substrate 202 is mounted to a carrier 240, e.g., a silicon carrier, by an adhesive 242.

Figure 2B:
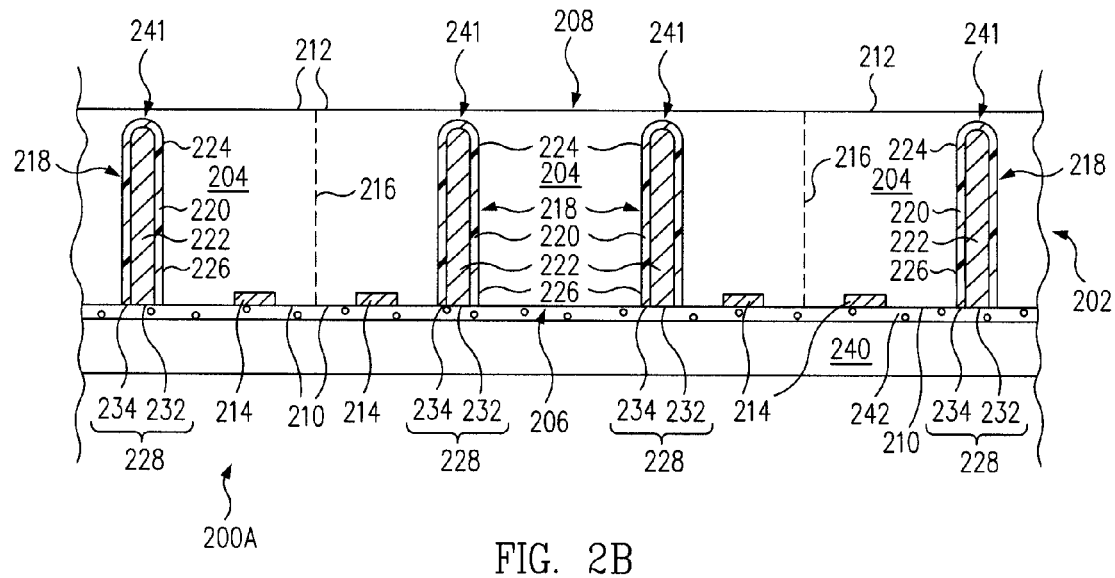
FIG. 2B is a cross-sectional view of an array in accordance with another embodiment.

FIG. 2B is a cross-sectional view of an array 200A in accordance with another embodiment. Array 200A of FIG. 2B is similar to array 200 of FIG. 2A and only the significant differences are discussed below.

In accordance with this embodiment, substrate 202 is thinned, sometimes called backgrinded, to almost expose through vias 218 at backside surface 208 of substrate 202. More particularly, through vias 218 remain enclosed within substrate 202 at backside surface 208.

As illustrated in FIG. 2B, through vias 218 have upper rounded ends 241 buried within substrate 202. Except at frontside surface 206, through via columns 222 are totally enclosed within through via passivation linings 220. Further, a portion of substrate 202, e.g., silicon, remains between upper rounded ends 241 and backside surface 208.

FIG. 3A is a cross-sectional view of array 200 of FIG. 2A at a later stage during fabrication in accordance with one embodiment. Referring now to FIGS. 1, 2A, and 3A together, from form through vias operation 102, flow moves to an etch backside surface to expose nubs of through vias operation 104.

In etch backside surface to expose nubs of through vias operation 104, backside surface 208 of substrate 202 is blanket etched, i.e., removed, to expose through via nubs 344 of through vias 218. In one embodiment, backside surface 208 is removed using a selective etch that etches substrate 202, e.g., silicon, but does not etch through vias 218, e.g., silicon oxide and copper.

Generally, in etch backside surface to expose nubs of through vias operation 104, substrate 202 is thinned from backside surface 208. Stated another way, a portion of substrate 202 at backside surface 208 as illustrated in FIG. 2A is removed to form a recessed backside surface 346 as illustrated in FIG. 3A. For example, a Si dry etch (DRIe) is performed to thin substrate 202.

Accordingly, after performance of etch backside surface to expose nubs of through vias operation 104, substrate 102 includes a recessed backside surface 346. Inactive surfaces 212 generally define recessed backside surface 346. For simplicity, the term recessed backside surface 346 shall be used herein and it is to be understood that this term generally include inactive surfaces 212.

The distance D2 between recessed backside surface 346 and frontside surface 206 as illustrated in FIG. 3A is less than the distance D1 between backside surface 208 and frontside surface 206 as illustrated in FIG. 2A. Stated another way, substrate 202 is thinned from an initial thickness equal to distance D1 (FIG. 2A) to a final thickness equal to distance D2 (FIG. 3A).

However, through vias 218 are not thinned and thus through via nubs 344 are exposed as illustrated in FIG. 3A. Through vias 218 are sometimes said to stand proud of or extend from recessed backside surface 346.

Through via nubs 344 are the upper portions of through vias 218 including the upper portions of through via passivation linings 220 and through via columns 222 exposed and uncovered by substrate 202. Through via nubs 344 are cylindrical protrusions protruding upwards from recessed backside surface 346.

Through via nubs 344, e.g., first portions of through vias 218, include inactive surface ends 230. Inactive surface ends 230 are spaced above recessed backside surface 346. Cylindrical enclosed, e.g., second, portions 348 of through vias 218 remain enclosed within and in contact with substrate 202.

Figure 3B:
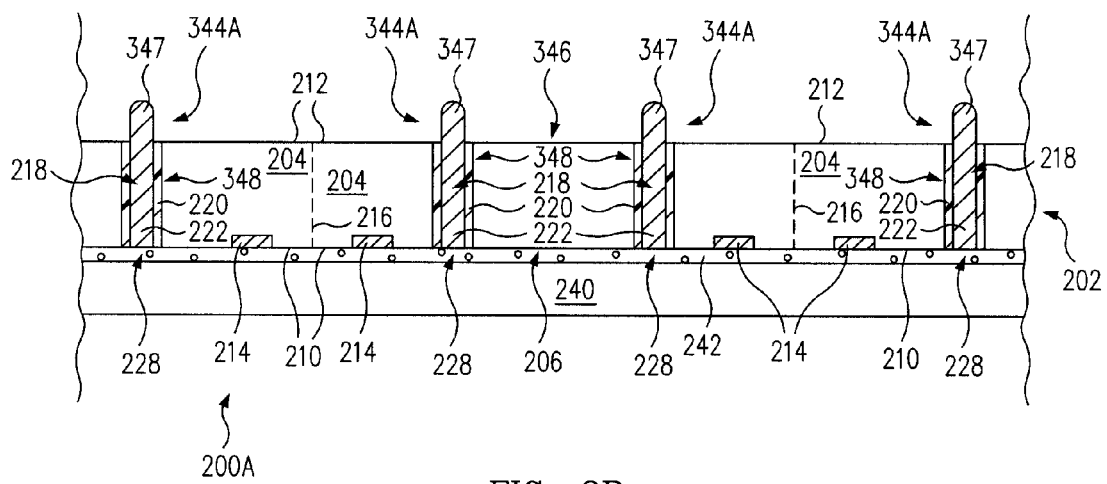
FIG. 3B is a cross-sectional view of the array of FIG. 2B at a later stage during fabrication in accordance with one embodiment.

FIG. 3B is a cross-sectional view of array 200A of FIG. 2B at a later stage during fabrication in accordance with one embodiment. Referring now to FIGS. 1, 2B, and 3B together, from form through vias operation 102, flow moves to etch backside surface to expose nubs of through vias operation 104.

In etch backside surface to expose nubs of through vias operation 104, backside surface 208 of substrate 202 is blanket etched, i.e., removed, to expose through via nubs 344A of through vias 218. In one embodiment, backside surface 208 is removed using a selective etch that etches substrate 202, e.g., silicon, but does not etch through vias 218, e.g., silicon oxide and copper. Then a selective etch to remove through via passivation linings 220, e.g., silicon oxide, exposed from recessed backside surface 346 is performed resulting in the structure as illustrated in FIG. 3B.

Generally, in etch backside surface to expose nubs of through vias operation 104, substrate 202 is thinned from backside surface 208 and the exposed portion of through via passivation linings 220 is removed. Stated another way, a portion of substrate 202 at backside surface 208 as illustrated in FIG. 2B is removed to form a recessed backside surface 346 as illustrated in FIG. 3B and the exposed portion of through via passivation linings 220 is removed to form through via nubs 344A, i.e., exposed portions of through via columns 222.

Accordingly, after performance of etch backside surface to expose nubs of through vias operation 104, substrate 102 includes a recessed backside surface 346.

However, through via columns 222 are not thinned and thus through via nubs 344A are exposed as illustrated in FIG. 3B. Through via columns 222 are sometimes said to stand proud of or extend from recessed backside surface 346.

Through via nubs 344A are the upper portions of through via columns 222 exposed and uncovered by substrate 202 after removal of the exposed portion of through via passivation linings 220. Through via nubs 344A include exposed upper rounded ends 347.

In the following figures and discussion, further operations on array 200 of FIG. 3A are discussed and illustrated. In light of this disclosure, those of skill in the art will understand that the discussion and illustrations are equally applicable to array 200A of FIG. 3B.

FIG. 4 is a cross-sectional view of array 200 of FIG. 3A at a later stage during fabrication in accordance with one embodiment. Referring now to FIGS. 1 and 4 together, from etch backside surface to expose nubs of through vias operation 104, flow moves to an apply backside passivation layer operation 106. In apply backside passivation layer operation 106, a backside passivation layer 450 is applied to recessed backside surface 346 of substrate 202 and through via nubs 344.

Backside passivation layer 450, sometimes called an insulation layer, includes a lower, e.g., first, passivation layer surface 452 directly attached to recessed backside surface 346. Backside passivation layer 450 further includes an opposite upper, e.g., second, passivation layer surface 454. Backside passivation layer 450 is a dielectric material.

In one embodiment, backside passivation layer 450 is formed from an organic material such as polyimide (PI), polybutyloxide (PBO), benzocyclobutene (BCB), a polymer, or other carbon containing material. In one embodiment, backside passivation layer 450 is formed by spinning, or spraying an organic material onto recessed backside surface 346 or applying a laminated film. In other embodiments, backside passivation layer 450 is an inorganic material, e.g., silicon oxide or silicon nitride, formed using a plasma enhanced chemical vapor deposition (PECVD) deposition process.

Backside passivation layer 450 has a thickness greater than the distance that through via nubs 344 protrude above recessed backside surface 346. Accordingly, through via nubs 344 are completely enclosed within backside passivation layer 450. More particularly, backside passivation layer 450 exists between inactive surface ends 230 of through vias 218 and upper passivation layer surface 454.

Figure 5:
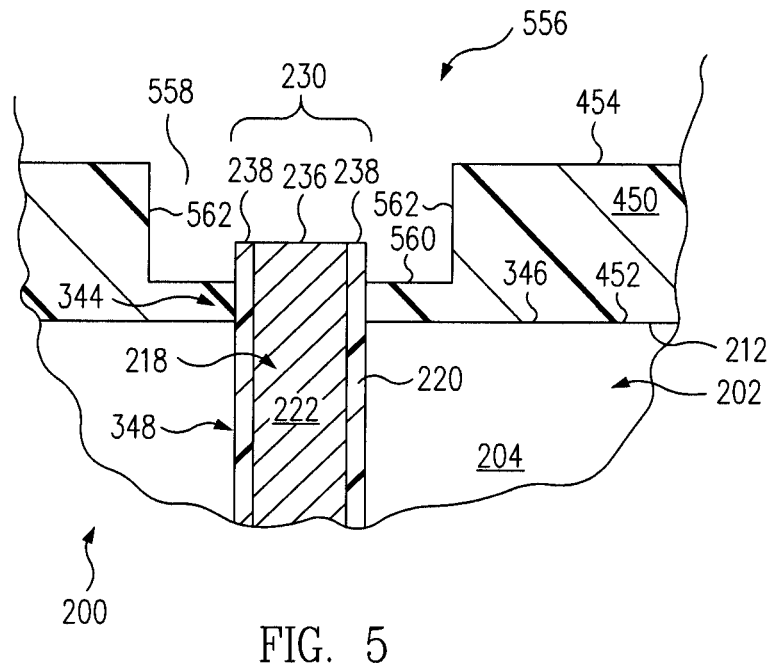
FIG. 5 is an enlarged cross-sectional view of the region V of the array of FIG. 4 at a later stage during fabrication in accordance with one embodiment.
Figure 6:
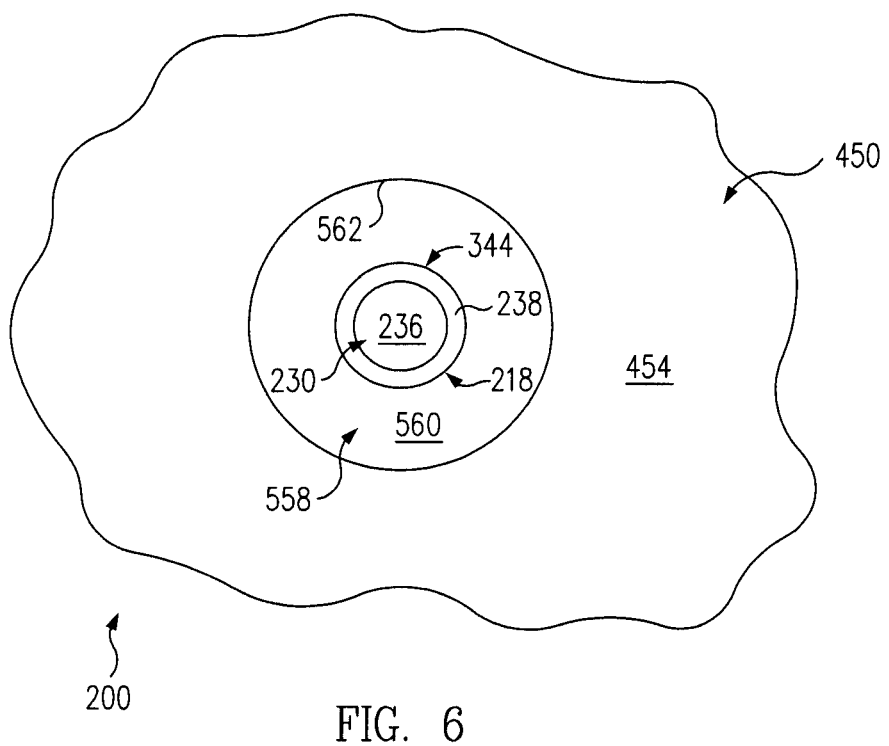
FIG. 6 is a top plan view of the array of FIG. 5 in accordance with one embodiment.

FIG. 5 is an enlarged cross-sectional view of the region V of array 200 of FIG. 4 at a later stage during fabrication in accordance with one embodiment. FIG. 6 is a top plan view of array 200 of FIG. 5 in accordance with one embodiment.

Referring now to FIGS. 1, 4, 5, and 6 together, from apply backside passivation layer operation 106, flow moves to a form laser-ablated artifacts in backside passivation layer operation 108. In form laser-ablated artifacts in backside passivation layer operation 108, laser-ablated artifacts 556 are formed in backside passivation layer 450.

Laser-ablated artifacts 556 are formed using a laser-ablation process. During this laser-ablation process, a laser beam is directed at backside passivation layer 450 and moved. The laser beam laser-ablates at least partially, and in some places through, backside passivation layer 450. Accordingly, laser-ablated artifacts 556 are formed at least partially, and in some places through, backside passivation layer 450.

In one embodiment, laser-ablated artifacts 556 include a laser-ablated land opening 558. More particularly, laser-ablated land opening 558 is an opening, e.g., a circular, rectangular, or other shaped opening, formed in backside passivation layer 450. Laser-ablated land opening 558 is an opening extending into backside passivation layer 450 to expose inactive surface end 230 of through via 218.

Laser-ablated land opening 558 is defined by land opening base 560, i.e., a recessed surface of backside passivation layer 450. Land opening base 560 is recessed below upper passivation layer surface 454 of backside passivation layer 450. Stated another way, land opening base 560 is between a plane defined by upper passivation layer surface 454 and a plane defined by lower passivation layer surface 452 such that backside passivation layer 450 remains between land opening base 560 and lower passivation layer surface 452 of backside passivation layer 450.

Inactive surface end 230 of through via 218 is exposed within laser-ablated land opening 558. More particularly, through via nub 344 protrudes upwards from land opening base 560 and into laser-ablated land opening 558.

Laser-ablated land opening 558 is further defined by a land opening sidewall 562. Land opening sidewall 562 extends between land opening base 560 and upper passivation layer surface 454 of backside passivation layer 450. Land opening sidewall 562 and land opening base 560 are portions of backside passivation layer 450.

Figure 7:
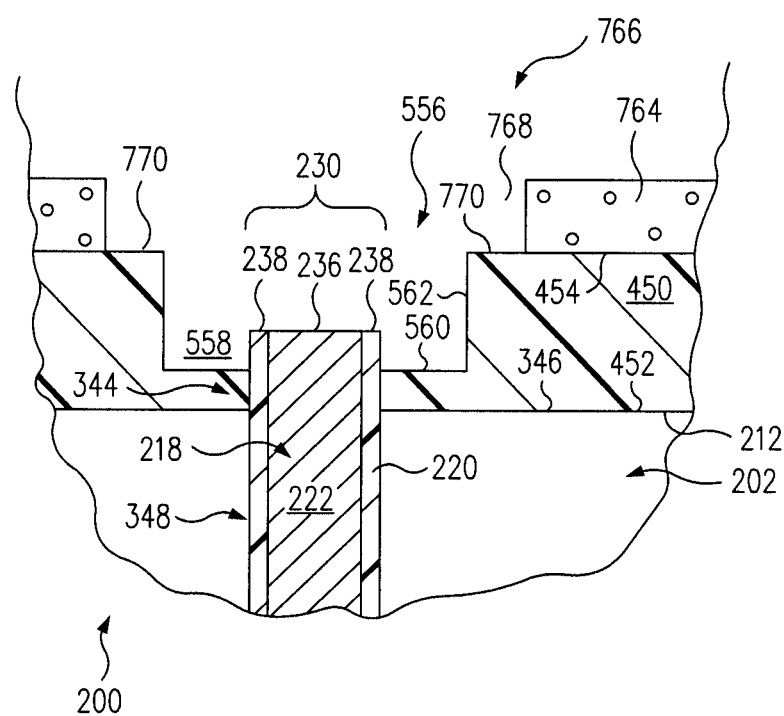
FIG. 7 is a cross-sectional view of the array of FIG. 5 at a later stage during fabrication in accordance with one embodiment.

FIG. 7 is a cross-sectional view of array 200 of FIG. 5 at a later stage during fabrication in accordance with one embodiment. Referring now to FIGS. 1 and 7 together, from form laser-ablated artifacts in backside passivation layer operation 108, flow moves to a fill laser-ablated artifacts to form embedded circuit features operation 110. In fill laser-ablated artifacts to form embedded circuit features operation 110, laser-ablated artifacts 556 formed in form laser-ablated artifacts in backside passivation layer operation 108 are filled with an electrically conductive material to form electrically conductive embedded circuit features as discussed below.

In accordance with the particular embodiment illustrated in FIG. 7, initially, in fill laser-ablated artifacts to form embedded circuit features operation 110, a mask 764 is formed on upper passivation layer surface 454. Mask 764 includes a circuit features pattern 766 formed therein. Circuit features pattern 766 includes an opening that is a positive image of the circuit features to be formed.

In accordance with this embodiment, circuit features pattern 766 includes a land pattern 768. Land pattern 768 is an opening extending through mask 764. Land pattern 768 is larger than laser-ablated land opening 558, which is exposed through land pattern 768. More particularly, laser-ablated land opening 558 and an annular portion 770 of upper passivation layer surface 454 around laser-ablated land opening 558 are exposed through land pattern 768. Further, inactive surface end 230 is exposed through land pattern 768.

Figure 8:
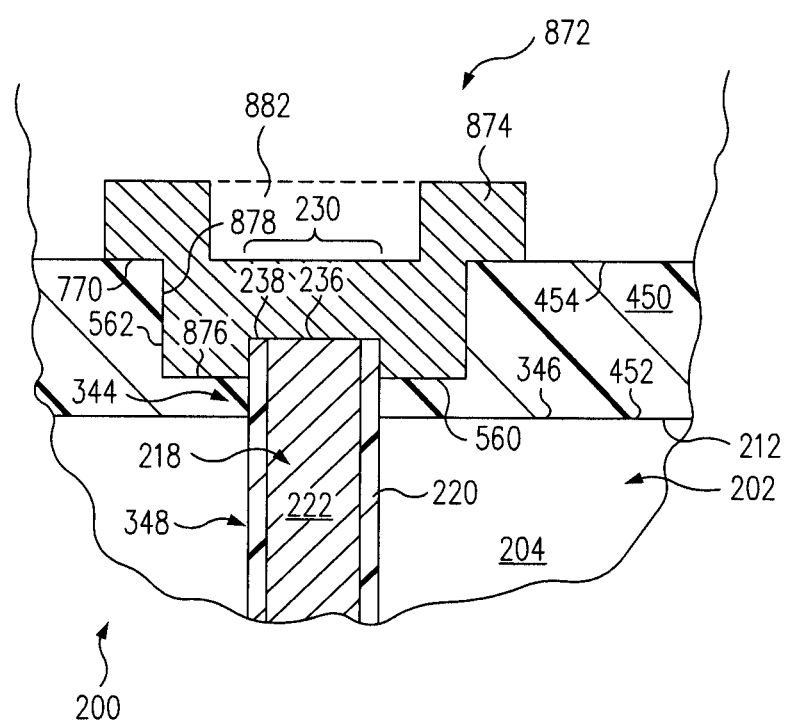
FIG. 8 is a cross-sectional view of the array of FIG. 7 at a later stage during fabrication in accordance with one embodiment.

FIG. 8 is a cross-sectional view of array 200 of FIG. 7 at a later stage during fabrication in accordance with one embodiment. Referring now to FIGS. 1, 7, and 8 together, further, in fill laser-ablated artifacts to form embedded circuit features operation 110, circuit features pattern 766 and laser-ablated artifacts 556 are filled, e.g., by plating, with an electrically conductive material, e.g., copper, to form one or more electrically conductive embedded circuit features 872, sometimes called an embedded circuit pattern. Mask 764 is then removed.

In accordance with this embodiment, land pattern 768 including laser-ablated land opening 558 are filled with an electrically conductive material to form an electrically conductive land 874. Land 874, i.e., an embedded circuit feature, is embedded, at least partially, within backside passivation layer 450.

Land 874 fills laser-ablated land opening 558 and is formed on land opening base 560 and land opening sidewall 562. Land 874 includes a land base 876 in direct contact with land opening base 560. Land base 876 is recessed below upper passivation layer surface 454 of backside passivation layer 450. Stated another way, land base 876 is between a plane defined by upper passivation layer surface 454 and a plane defined by lower passivation layer surface 452 such that backside passivation layer 450 remains between land base 876 and lower passivation layer surface 452.

Land 874 further includes a land sidewall 878 in direct contact with land opening sidewall 562. Land sidewall 878 extends between land base 876 and upper passivation layer surface 454 of backside passivation layer 450.

Land 872 further extends onto upper passivation layer surface 454, and specifically, onto annular portion 770. In one embodiment, land 874 follows the contour of laser-ablated land opening 558 and land pattern 768 and includes a central recess 882. However, in another embodiment, land 874 includes a smooth upper surface as indicated by the dashed line.

Land 874 contacts inactive surface end 230 including inactive surface column end 236 of through via column 222. Accordingly, land 874 is electrically connected to through via column 222. Land 874 provides an electrically conductive area to which additional structures can be connected, such as for example, solder balls, stacked packages, and/or stacked electronic components.

By forming embedded circuit features 872 within laser-ablated artifacts 556 in backside passivation layer 450, the cost of fabricating array 200 is minimized. More particularly, the number of operations to form embedded circuit features 872 is minimized thus minimizing fabrication cost of array 200.

As discussed above, a portion of land 874 is formed on upper passivation layer surface 454. In one embodiment, mask 764 is further patterned and filled to form other electrically conductive features on upper passivation layer surface 454. Illustratively, circuit traces and/or lands are formed on upper passivation layer surface 454.

In another embodiment, mask 764 is not formed. In accordance with this embodiment, land 874 is formed entirely within laser-ablated land opening 558.

FIG. 9 is an enlarged cross-sectional view of the region V of array 200 of FIG. 4 at a later stage during fabrication in accordance with another embodiment. FIG. 10 is a top plan view of array 200 of FIG. 9 in accordance with one embodiment. Referring now to FIGS. 1, 9, and 10 together, in form laser-ablated artifacts in backside passivation layer operation 108, laser-ablated artifacts 556 are formed as discussed above.

In accordance with this embodiment, laser-ablated artifacts 556 include a first laser-ablated land opening 558A, a second laser-ablated land opening 558B, and a laser-ablated trace channel 984. Laser-ablated land openings 558A, 558B include land opening bases 560 and land opening sidewalls 562 as described above.

Laser-ablated trace channel 984 extends between and connects laser-ablated land openings 558A, 558B. Laser-ablated trace channel 984, sometimes called a trench, extends horizontally and in a direction parallel with upper passivation layer surface 454 of backside passivation layer 450.

Laser-ablated trace channel 984 is defined by a trace channel base 986, i.e., a recessed surface of backside passivation layer 450. Trace channel base 986 is recessed below upper passivation layer surface 454 of backside passivation layer 450. Stated another way, trace channel base 986 is between a plane defined by upper passivation layer surface 454 and a plane defined by lower passivation layer surface 452 such that backside passivation layer 450 remains between trace channel base 986 and lower passivation layer surface 452.

Laser-ablated trace channel 984 is further defined by trace channel sidewalls 988. Trace channel sidewalls 988 extend between trace channel base 986 and upper passivation layer surface 454 of backside passivation layer 450. Trace channel sidewalls 988 and trace channel base 986 are portions of backside passivation layer 450.

Figure 11:
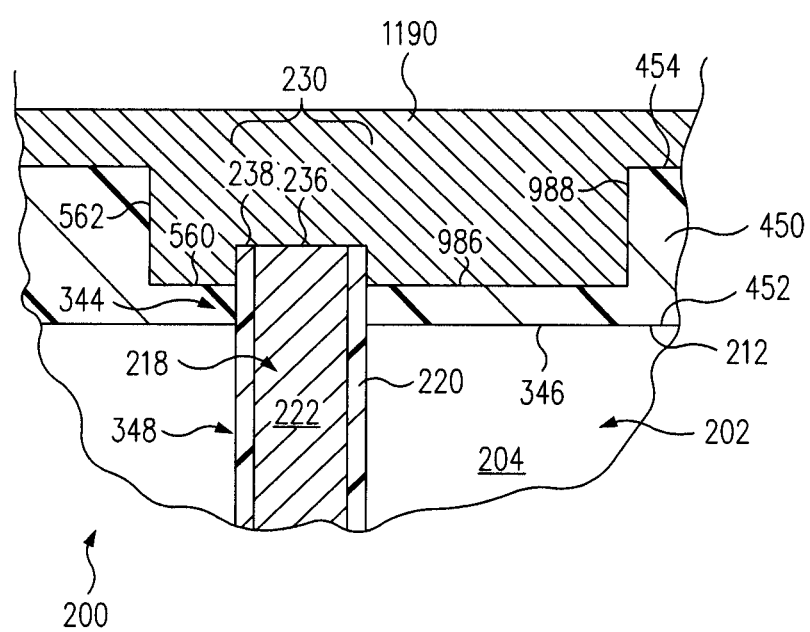
FIG. 11 is a cross-sectional view of the array of FIG. 9 at a later stage during fabrication in accordance with one embodiment.

FIG. 11 is a cross-sectional view of array 200 of FIG. 9 at a later stage during fabrication in accordance with one embodiment. Referring now to FIGS. 1, 9-11 together, initially, in fill laser-ablated artifacts to form embedded circuit features operation 110, laser-ablated artifacts 556 are filled, e.g., by plating, with an electrically conductive material 1190, e.g., copper. As illustrated in FIG. 11, electrically conductive material 1190 is overplated to cover upper passivation layer surface 454 in addition to filling laser ablated land openings 558A, 558B and laser-ablated trace channel 984.

Figure 12:
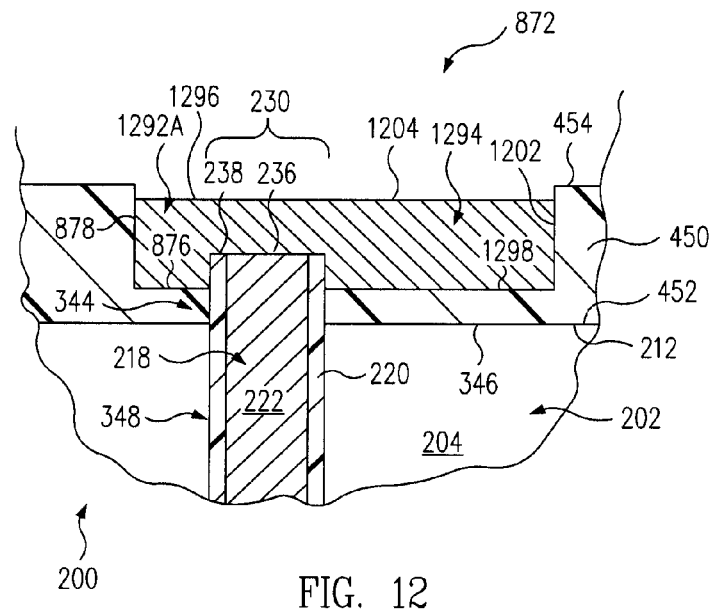
FIG. 12 is a cross-sectional view of the array of FIG. 11 at a later stage during fabrication in accordance with one embodiment.
Figure 13:
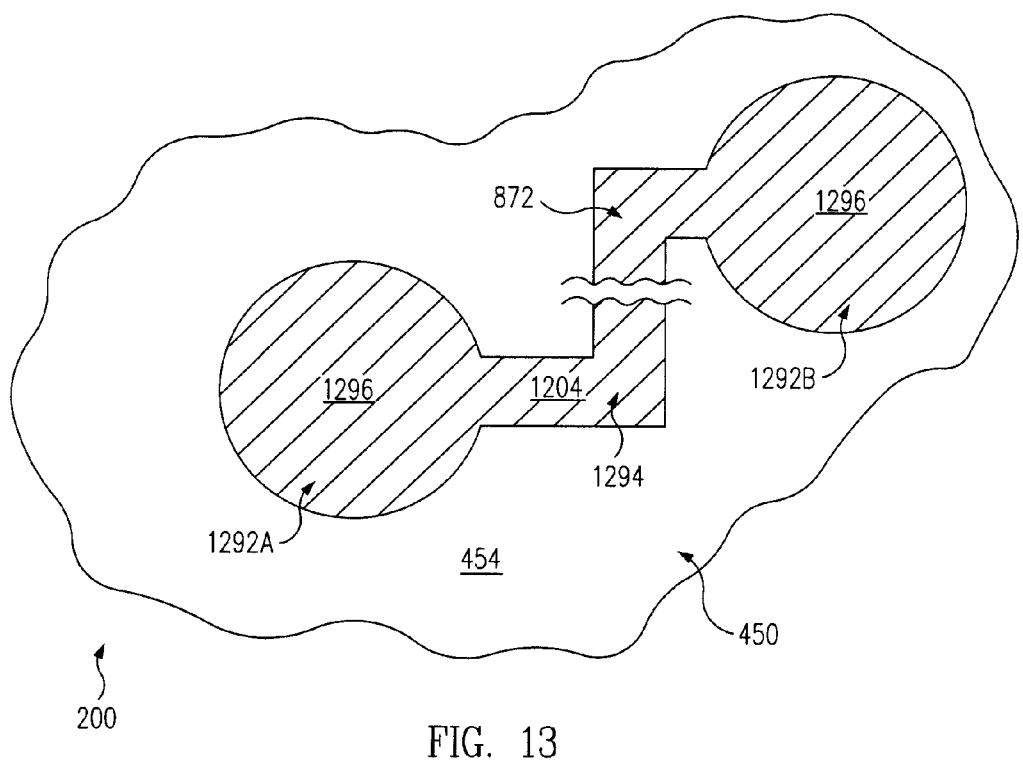
FIG. 13 is a top plan view of the array of FIG. 12 in accordance with one embodiment.

FIG. 12 is a cross-sectional view of array 200 of FIG. 11 at a later stage during fabrication in accordance with one embodiment. FIG. 13 is a top plan view of array 200 of FIG. 12 in accordance with one embodiment. Referring now to FIGS. 1, 9-13 together, further, in fill laser-ablated artifacts to form embedded circuit features operation 110, electrically conductive material 1190 is removed, e.g., etched, to form one or more electrically conductive embedded circuit features 872 within laser-ablated artifacts 556. In one embodiment, electrically conductive material 1190 is slightly over etched to be slightly recessed below upper passivation layer surface 454 of backside passivation layer 450.

In accordance with this embodiment, embedded circuit features 872 are entirely embedded in backside passivation layer 450. Embedded circuit features 872 include a first land 1292A, a second land 1292B, and a trace 1294 formed within laser ablated land openings 558A, 558B, and trace channel 984, respectively. Lands 1292A, 1292B include land bases 876 and land sidewalls 878 similar to land base 876 and land sidewall 878 of land 874 as illustrated in FIG. 8 and discussed above. Lands 1292A, 1292B further includes land top surfaces 1296 coplanar with upper passivation layer surface 454 of backside passivation layer 450, or slightly recessed below.

Land 1292A contacts inactive surface end 230 including inactive surface column end 236 of through via column 222. Accordingly, land 1292A is electrically connected to through via column 222.

Trace 1294 includes a trace base 1298 in direct contact with trace channel base 986. Traces base 1298 is recessed below upper passivation layer surface 454 of backside passivation layer 450. Stated another way, trace base 1298 is between a plane defined by upper passivation layer surface 454 and a plane defined by lower passivation layer surface 452 such that backside passivation layer 450 remains between trace base 1298 and lower passivation layer surface 452.

Trace 1294 further includes trace sidewalls 1202 in direct contact with trace channel sidewalls 988. Traces sidewalls 1202 extend between trace base 1298 and upper passivation layer surface 454 of backside passivation layer 450, or are slightly recessed below. Trace 1294 further includes trace top surface 1204 coplanar with upper passivation layer surface 454 of backside passivation layer 450, or slightly recessed below.

Trace 1294 electrically connects lands 1292A, 1292B to one another. Lands 1292A, 1292B provide electrically conductive areas to which additional structures can be connected, such as for example, solder balls, stacked packages, and/or stacked electronic components.

Although embedded circuit features 872 including lands 1292A, 1292B, and trace 1294 are illustrated in FIGS. 12 and 13 and discussed above, in light of this disclosure, those of skill in the art will understand that embedded circuit features 872 include other embedded electrically conductive features such as a plurality of lands, traces and/or vias embedded within backside passivation layer 450 in other embodiments.

Figure 14:
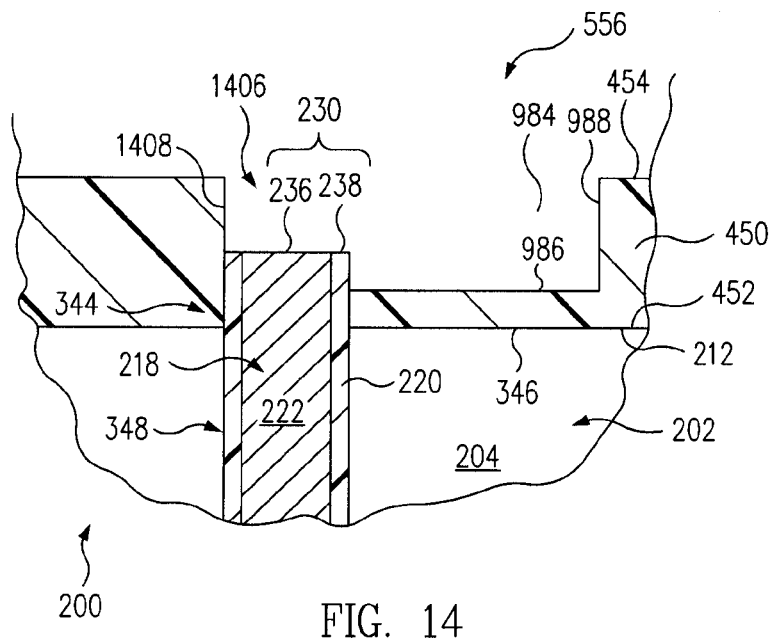
FIG. 14 is an enlarged cross-sectional view of the region V of the array of FIG. 4 in accordance with yet another embodiment.
Figure 15:
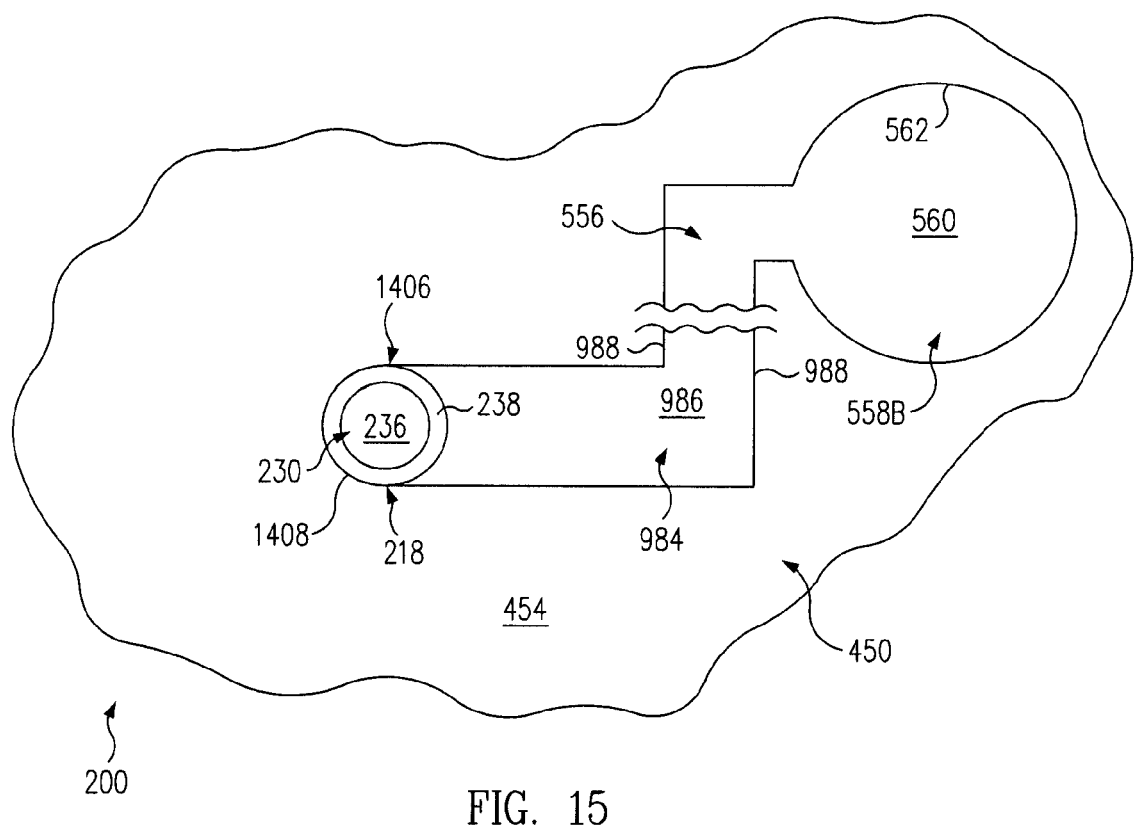
FIG. 15 is a top plan view of the array of FIG. 14 in accordance with one embodiment.

FIG. 14 is an enlarged cross-sectional view of the region V of array 200 of FIG. 4 in accordance with yet another embodiment. FIG. 15 is a top plan view of array 200 of FIG. 14 in accordance with one embodiment. Referring now to FIGS. 1, 14, and 15 together, in form laser-ablated artifacts in backside passivation layer operation 108, laser-ablated artifacts 556 are formed as discussed above.

In accordance with this embodiment, laser-ablated artifacts 556 include a laser-ablated via aperture 1406, laser-ablated land opening 558B, and laser-ablated trace channel 984. Laser-ablated land opening 558B and laser-ablated trace channel 984 are similar or identical to laser-ablated land opening 558B and laser-ablated trace channel 984 as discussed above in relation to FIGS. 9 and 10, respectively, and so the discussion is not repeated here.

Laser-ablated via aperture 1406, sometimes called a blind via opening, is an opening (aperture) extending entirely through backside passivation layer 450 in a direction perpendicular to upper passivation layer surface 454 of backside passivation layer 450. More particularly, laser-ablated via aperture 1406 extends entirely through backside passivation layer 450 and to inactive surface end 230 of through via 218. Accordingly, inactive surface end 230 including inactive surface column end 236 are exposed through via aperture 1406. Although a precise alignment of via aperture 1406 and inactive surface end 230 is illustrated in FIGS. 14-15, in light of this disclosure, those of skill in the art will understand that a small degree of misalignment between via aperture 1406 and inactive surface end 230 can exist due to the tolerance in positioning of via aperture 1406 with respect to inactive surface end 230.

Laser-ablated via aperture 1406 is defined by a via aperture sidewall 1408 extending between upper passivation layer surface 454 of backside passivation layer 450 and inactive surface end 230 of through via 218. Via aperture sidewall 1408 is a portion of backside passivation layer 450. Trace channel 984 extends between and connects laser-ablated via aperture 1406 with laser-ablated land opening 558B.

Figure 16:
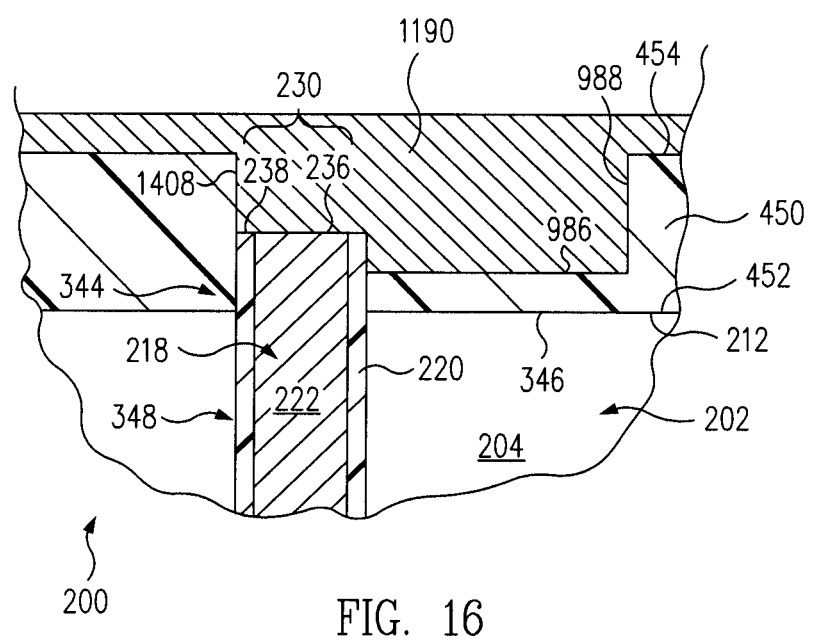
FIG. 16 is a cross-sectional view of the array of FIG. 14 at a later stage during fabrication in accordance with one embodiment.

FIG. 16 is a cross-sectional view of array 200 of FIG. 14 at a later stage during fabrication in accordance with one embodiment. Referring now to FIGS. 1, 14-16 together, initially, in fill laser-ablated artifacts to form embedded circuit features operation 110, laser-ablated artifacts 556 are filled, e.g., by plating, with an electrically conductive material 1190, e.g., copper. As illustrated in FIG. 16, electrically conductive material 1190 is overplated to cover upper passivation layer surface 454 in addition to filling laser ablated via aperture 1406, laser ablated land opening 558B, and laser-ablated trace channel 984.

Figure 17:
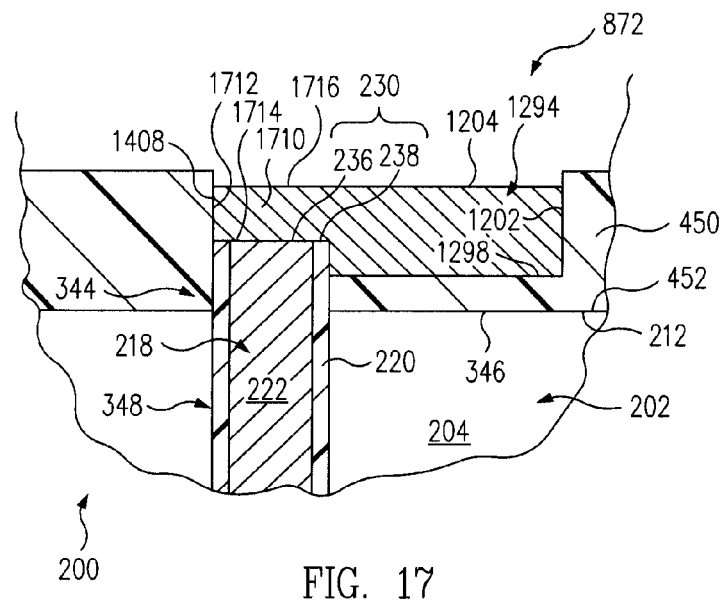
FIG. 17 is a cross-sectional view of the array of FIG. 16 at a later stage during fabrication in accordance with one embodiment.
Figure 18:
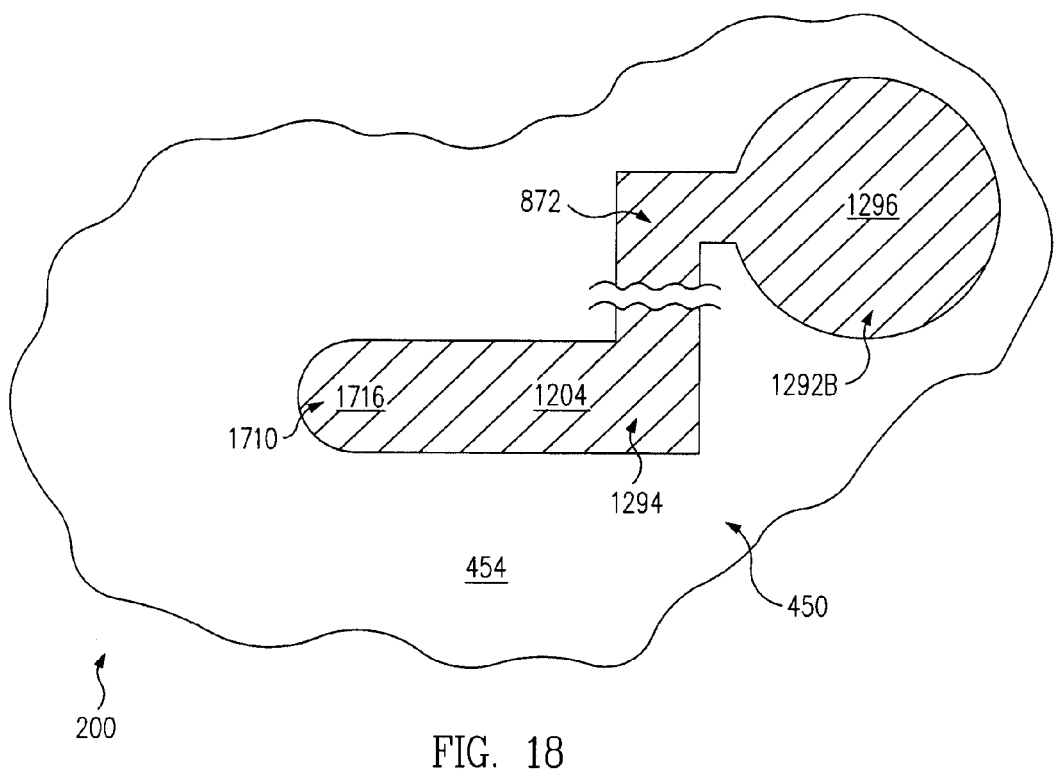
FIG. 18 is a top plan view of the array of FIG. 17 in accordance with one embodiment.

FIG. 17 is a cross-sectional view of array 200 of FIG. 16 at a later stage during fabrication in accordance with one embodiment. FIG. 18 is a top plan view of array 200 of FIG. 17 in accordance with one embodiment. Referring now to FIGS. 1, 14-18 together, further, in fill laser-ablated artifacts to form embedded circuit features operation 110, electrically conductive material 1190 is removed, e.g., etched, to form one or more electrically conductive embedded circuit features 872 within laser-ablated artifacts 556. In one embodiment, electrically conductive material 1190 is slightly over etched to be recessed below upper passivation layer surface 454 of backside passivation layer 450.

In accordance with this embodiment, embedded circuit features 872 include a via 1710, e.g., a blind via, trace 1294, and land 1292B. Trace 1294 and land 1292B are similar or identical to trace 1294 and land 1292B as discussed above in relation to FIGS. 12 and 13, respectively, and so the discussion is not repeated here.

Via 1710 is formed within via aperture 1406. Via 1710 includes a via sidewall 1712 in direct contact with via aperture sidewall 1408. Via sidewall 1712 extends between inactive surface end 230 of through via 218 and upper passivation layer surface 454 of backside passivation layer 450, or is slightly recessed below. Via 1710 further includes a via base surface 1714 formed on and coplanar with inactive surface end 230 of through via 218. Via base surface 1714 is formed directly on inactive surface end 230 such that via 1710 is electrically connected to inactive surface column end 236 of through via column 222. Via 1710 further includes a via top surface 1716 coplanar, or slightly recessed below, upper passivation layer surface 454 of backside passivation layer 450.

Trace 1294 electrically connects via 1710 to land 1292B. Land 1292B provides an electrically conductive area to which additional structures can be connected, such as for example, solder balls, stacked packages, and/or stacked electronic components.

Although embedded circuit features 872 including via 1710, land 1292B, and trace 1294 are illustrated in FIGS. 17-18 and discussed above, in light of this disclosure, those of skill in the art will understand that embedded circuit features 872 include other embedded electrically conductive features such as a plurality of lands, traces and/or vias embedded within backside passivation layer 450 in other embodiments.

Referring again to FIGS. 1 and 4 together, in one embodiment, after performance of fill laser-ablated artifacts to form embedded circuit features operation 110, carrier 240 is removed.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. A method comprising:
   forming through vias in a substrate;
   blanket etching a backside surface of the substrate to expose nubs of the through vias from the backside surface of the substrate;
   applying a first passivation layer surface of a backside passivation layer directly to the backside surface of the substrate subsequent to the blanket etching;
   forming laser-ablated artifacts in the backside passivation layer, the laser-ablated artifacts comprising recessed surfaces, the backside passivation layer remaining between the recessed surfaces and the first passivation layer surface, the nubs protruding from the recessed surfaces into the laser-ablated artifacts; and
   filling the laser-ablated artifacts with an electrically conductive material.

2. The method of claim 1 wherein the filling further comprises forming electrically conductive circuit features.

3. The method of claim 2 wherein the circuit features are at least partially embedded in the backside passivation layer.

4. The method of claim 2 wherein the circuit features are entirely embedded in the backside passivation layer.

5. The method of claim 2 wherein the laser-ablated artifacts comprise a land opening and the circuit features comprise a land in the land opening.

6. The method of claim 2 wherein the laser-ablated artifacts comprise a trace channel and the circuit features comprise a trace in the trace channel.

7. The method of claim 2 wherein the laser-ablated artifacts comprise a via aperture and the circuit features comprise a via in the via aperture.

8. The method of claim 1 wherein the applying comprises covering the nubs in the backside passivation layer.

9. The method of claim 8 wherein the forming laser-ablated artifacts comprises exposing the nubs.

10. The method of claim 9 wherein the filling comprises forming electrically conductive circuit features coupled to the nubs.

11. The method of claim 1 wherein the filling comprises:
    forming a mask comprising a circuit features pattern;
    filling the circuit features pattern and the laser-ablated artifacts to form electrically conductive circuit features; and
    removing the mask.

12. The method of claim 11 wherein the circuit features are partially embedded in the backside passivation layer and extend onto a surface of the backside passivation layer.

13. A method comprising:
    forming through vias in a substrate;
    blanket etching a backside surface of the substrate to expose nubs of the through vias from the backside surface of the substrate;
    applying a backside passivation layer to enclose the nubs subsequent to the blanket etching;
    forming laser-ablated artifacts in the backside passivation layer to expose the nubs, the laser-ablated artifacts comprising recessed surfaces, the backside passivation layer remaining between the recessed surfaces and a first passivation layer surface of the backside passivation layer, the nubs protruding from the recessed surfaces into the laser-ablated artifacts; and
    forming circuit features within the laser-ablated artifacts.

14. The method of claim 13 wherein the through vias comprise through via passivation linings and through via columns, the nubs comprising portions of the through via passivation linings and the through via columns exposed from the backside surface of the substrate.

15. The method of claim 13 wherein the through vias comprise through via passivation linings and through via columns, the nubs consisting of portions of the through via columns exposed from the backside surface of the substrate.

16. The method of claim 15 wherein the nubs comprise upper rounded ends.

17. A method comprising:
    forming through vias in a substrate;
    blanket etching a backside surface of the substrate to expose nubs of the through vias from the backside surface of the substrate;
    applying a backside passivation layer to enclose the nubs subsequent to the blanket etching; and
    forming circuit features at least partially embedded in the backside passivation layer, the circuit features being coupled to the nubs, the circuit features comprising recessed surfaces, the backside passivation layer remaining between the recessed surfaces and a first passivation layer surface of the backside passivation layer, the nubs protruding from the recessed surfaces into the circuit features.

18. The method of claim 17 wherein the forming circuit features comprises:
    forming laser-ablated artifacts in the backside passivation layer to expose the nubs; and
    forming the circuit features within the laser-ablated artifacts.

19. The method of claim 17 wherein the circuit features are selected from the group consisting of lands, traces, and vias.

* * * * *